(12) United States Patent
Guzek et al.

(10) Patent No.: US 9,113,547 B2
(45) Date of Patent: Aug. 18, 2015

(54) SAME LAYER MICROELECTRONIC CIRCUIT PATTERNING USING HYBRID LASER PROJECTION PATTERNING (LPP) AND SEMI-ADDITIVE PATTERNING(SAP)

(75) Inventors: John Guzek, Chandler, AZ (US); Yonggang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1046 days.

(21) Appl. No.: 12/257,688

(22) Filed: Oct. 24, 2008

(65) Prior Publication Data

US 2010/0101084 A1    Apr. 29, 2010

(51) Int. Cl.
| | |
|---|---|
| *H01K 3/22* | (2006.01) |
| *H05K 3/00* | (2006.01) |
| *H05K 3/02* | (2006.01) |
| *H05K 1/02* | (2006.01) |
| *H05K 3/04* | (2006.01) |
| *H05K 3/10* | (2006.01) |

(52) U.S. Cl.
CPC ............ *H05K 3/0026* (2013.01); *H05K 1/0265* (2013.01); *H05K 3/02* (2013.01); *H05K 3/045* (2013.01); *H05K 3/107* (2013.01); *H05K 3/0032* (2013.01); *H05K 3/108* (2013.01); *H05K 2201/0394* (2013.01); *H05K 2201/09036* (2013.01); *H05K 2201/09563* (2013.01); *H05K 2201/09727* (2013.01); *H05K 2203/0542* (2013.01); *Y10T 29/49156* (2015.01)

(58) Field of Classification Search
CPC ....... H05K 3/02; H05K 3/0026; H05K 3/045; H05K 3/107; H05K 3/108; H05K 2201/0394; H05K 2201/09563; H05K 2201/09036; H05K 2201/09727; H05K 2203/0542; Y10T 29/49156

USPC .......... 29/848; 148/525; 264/400; 219/121.6, 219/121.66, 121.69; 174/260, 261
See application file for complete search history.

(56) References Cited

U.S. PATENT DOCUMENTS

| | | |
|---|---|---|
| 4,554,404 A | 11/1985 | Gilder, Jr. et al. |
| 5,559,584 A | 9/1996 | Miyaji et al. |

(Continued)

FOREIGN PATENT DOCUMENTS

| | | |
|---|---|---|
| CN | 1225510 A | 8/1999 |
| CN | 1294540 A | 5/2001 |

(Continued)

OTHER PUBLICATIONS

Dahotre et al., "Laser Fabrication and Machining of Materials", 2008, Springer eBook, chapter 4: Laser Drilling, pp. 97-143.*

(Continued)

*Primary Examiner* — Peter DungBa Vo
*Assistant Examiner* — Jeffrey T Carley
(74) *Attorney, Agent, or Firm* — Schwegman Lundberg & Woessner, P.A.

(57) ABSTRACT

In some embodiments, same layer microelectronic circuit patterning using hybrid laser projection patterning (LPP) and semi-additive patterning (SAP) is presented. In this regard, a method is introduced including patterning a first density region of a laminated substrate surface using LPP, patterning a second density region of the laminated substrate surface using SAP, and plating the first and second density regions of the laminated substrate surface, wherein features spanning the first and second density regions are directly coupled. Other embodiments are also disclosed and claimed.

7 Claims, 5 Drawing Sheets

(56) References Cited

U.S. PATENT DOCUMENTS

| | | | |
|---|---|---|---|
| 6,258,629 | B1 | 7/2001 | Niones et al. |
| 6,563,079 | B1 * | 5/2003 | Umetsu et al. ............ 219/121.71 |
| 6,719,916 | B2 | 4/2004 | Dubowski et al. |
| 2004/0266060 | A1 * | 12/2004 | Muramatsu et al. .......... 438/106 |
| 2007/0141757 | A1 | 6/2007 | Nomura |
| 2007/0144769 | A1 | 6/2007 | Salama |
| 2007/0158854 | A1 * | 7/2007 | Lotz ............................. 257/778 |
| 2008/0001297 | A1 | 1/2008 | Lotz et al. |
| 2008/0020132 | A1 | 1/2008 | Huemoeller et al. |

FOREIGN PATENT DOCUMENTS

| | | |
|---|---|---|
| CN | 1526166 A | 9/2004 |
| CN | 1747157 A | 3/2006 |
| CN | 1988765 A | 6/2007 |
| CN | 101141851 A | 3/2008 |
| CN | 102171788 A | 8/2011 |
| JP | 11111884 A | 4/1999 |
| JP | 2000246474 A | 9/2000 |
| JP | 2004240216 A | 8/2004 |
| TW | 201032690 A1 | 9/2010 |
| WO | WO-2007078716 A1 | 7/2007 |
| WO | 2010/047977 A2 | 4/2010 |
| WO | 2010/047977 A3 | 7/2010 |

OTHER PUBLICATIONS

Korner et al., "Physical and material aspects in using visible laser pulses of nanosecond duration for ablation", 1996, Applied Physics A, pp. 123-131.*

International Preliminary Report on Patentability received for PCT Patent Application No. PCT/US2009/060216, mailed on May 5, 2011, 6 pages.

International Search Report for corresponding matter, mailed May 20, 2010.

"Chinese Application Serial No. 200980139243.0, Office Action mailed Dec. 26, 2012", 18 pgs.

"Taiwanese Application Serial No. 98134625, Office Action mailed Feb. 7, 2013", 14 pgs.

"Chinese Application Serial No. 200980139243.0, Office Action mailed Aug. 16, 2013", w/English translation, 10 pgs.

"Chinese Application Serial No. 200980139243.0, Response filed May 6, 2013 to Office Action mailed Dec. 26, 2012", w/English translation of claims, 13 pgs.

"Japanese Application Serial No. 2011-533223, Office Action mailed Mar. 26, 2013", w/English translation, 6 pgs.

"Japanese Application Serial No. 2011-533223, Response filed Jul. 12, 2013 to Office Action mailed Mar. 26, 2013", w/English translation of claims, 7 pgs.

"Korean Application Serial No. 2011-7007695, Response filed Mar. 28, 2013 to Office Action mailed Dec. 28, 2012", English currently pending claims only, 3 pgs.

"Korean Application Serial No. 2011-7007695, Response filed Aug 22, 2012 to Office Action mailed Jun. 22, 2012", English currently pending claims only, 3 pgs.

"Taiwanese Application Serial No. 98134625, Office Action mailed Oct. 8, 2013", w/English translation, 8 pgs.

"Taiwanese Application Serial No. 98134625, Response filed Apr. 29, 2013 to Office Action mailed Jan. 29, 2013", w/English translation, 10 pgs.

"Chinese Application Serial No. 200980139243.0, Response filed Oct. 30, 2013 to Office Action mailed Aug. 16, 2013", w/English claims, 6 pgs.

* cited by examiner

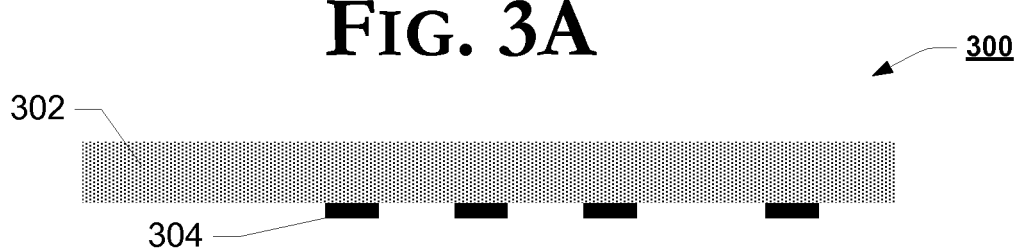
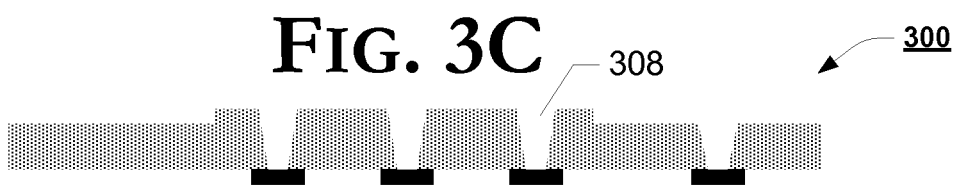

SAME LAYER MICROELECTRONIC CIRCUIT PATTERNING USING HYBRID LASER PROJECTION PATTERNING (LPP) AND SEMI-ADDITIVE PATTERNING(SAP)

FIELD OF THE INVENTION

Embodiments of the present invention generally relate to the field of integrated circuit package substrates, and, more particularly to same layer microelectronic circuit patterning using hybrid laser projection patterning (LPP) and semi-additive patterning (SAP).

BACKGROUND OF THE INVENTION

Reductions in the size and pitch of integrated circuit devices require advancements in the manufacture of IC package substrates. The use of lasers is becoming more common for patterning substrates. Disadvantageously, the use of laser projection patterning to pattern a substrate layer tends to cost much more than semi-additive patterning.

BRIEF DESCRIPTION OF THE DRAWINGS

The present invention is illustrated by way of example and not limitation in the figures of the accompanying drawings in which like references indicate similar elements, and in which:

FIGS. 3A-3K are graphical illustrations of a cross-sectional view of a partially formed IC package substrate, in accordance with one example embodiment of the invention.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
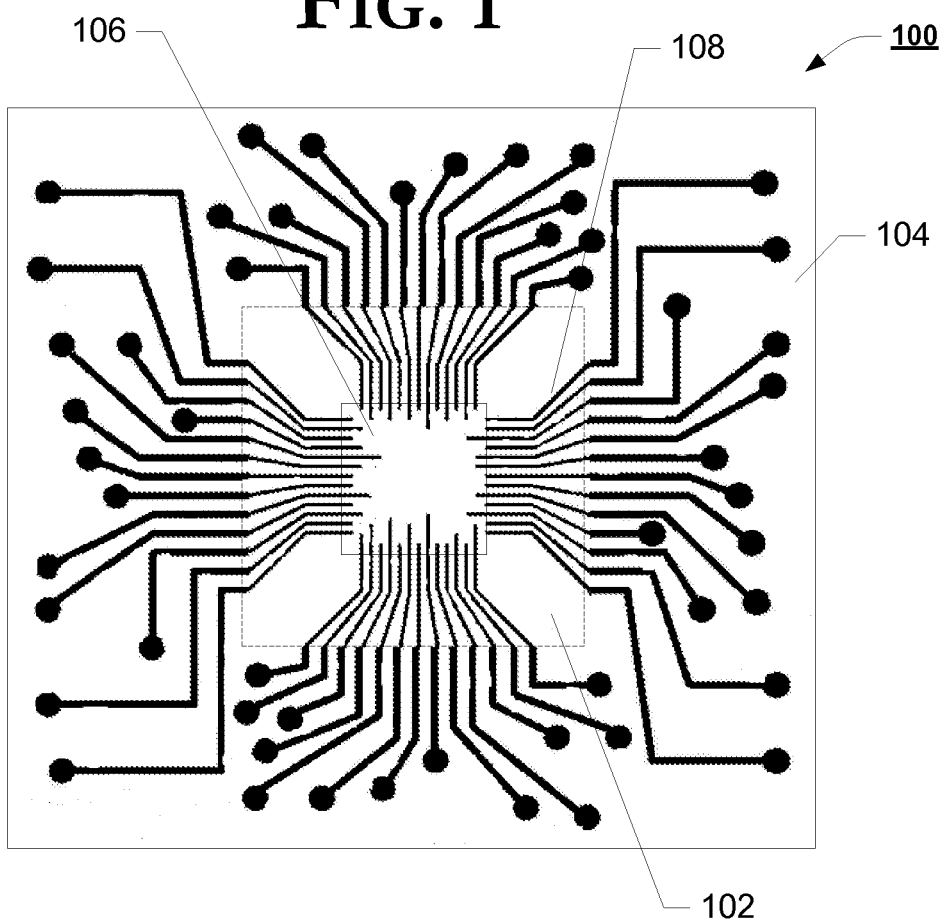
FIG. 1 is a graphical illustration of an overhead view of a package substrate surface, in accordance with one example embodiment of the invention.

FIG. 1 is a graphical illustration of an overhead view of a package substrate surface, in accordance with one example embodiment of the invention. In accordance with the illustrated example embodiment, package substrate 100 includes one or more of necking region 102, main routing region 104, die shadow 106, and signal trace 108.

Necking region 102 represents a region on the surface of substrate 100 where signals, such as signal trace 108 routed to escape from an integrated circuit die, which would occupy die shadow 106. In one embodiment, signal traces 108 are input/output (I/O) signals that are routed from outer bumps of the integrated circuit die. Necking region 102 generally has a higher density than main routing region 104. In one embodiment, necking region 102 contains line widths of about 9 micrometers and spaces of about 12 micrometers. In one embodiment, main routing region 104 contains line widths of greater than about 14 micrometers and spaces of greater than about 14 micrometers. In one embodiment, signal traces 108 have a length within necking region 102 of a few millimeters. As shown, necking region 102 is slightly larger than die shadow 106.

As described in embodiments hereafter, same layer microelectronic circuit patterning may use laser projection patterning (LPP) in necking region 102 and semi-additive patterning (SAP) in main routing region 104. Signal traces 108 are seamlessly spanned (for example, continuous copper traces) across both regions.

Figure 2A:
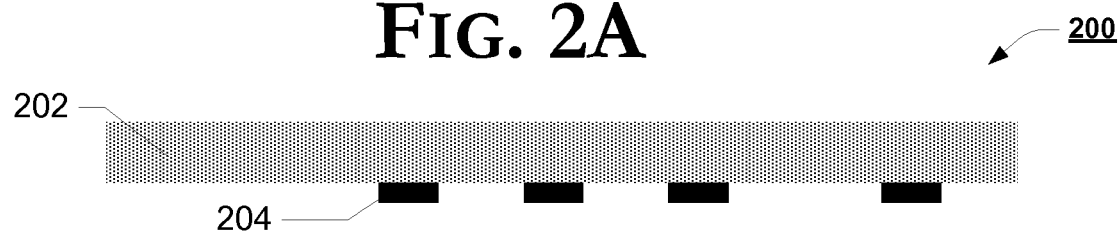
FIGS. 2A-2J are graphical illustrations of a cross-sectional view of a partially formed IC package substrate, in accordance with one example embodiment of the invention.

FIGS. 2A-2J are graphical illustrations of a cross-sectional view of a partially formed IC package substrate, in accordance with one example embodiment of the invention. FIG. 2A depicts substrate 200 after build-up dielectric 202 is laminated on a core or existing build-up layers, including pads 204, followed with pre-cure of the dielectric. The dielectric materials are generally polymer based and filled with dispersed silica fillers, such as commercially available fillers and a variety of other materials.

Figure 2B:

FIG. 2B depicts substrate 200 after laser via 206 drilling over the whole pattern and desmear. The desmear process comprises of swelling the walls of via 206 using alkali solution such as sodium hydroxide, and them etching with highly reductive chemical such as permanganate based aqueous solution.

Figure 2C:
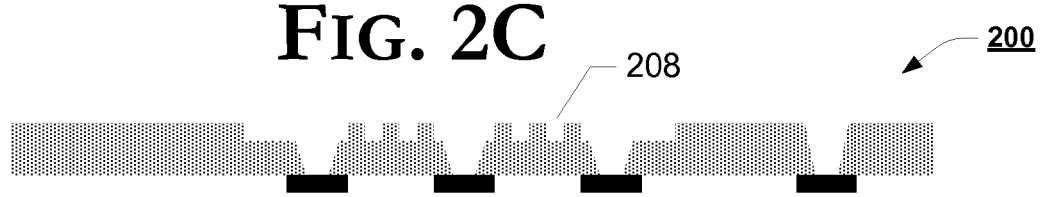

FIG. 2C depicts substrate 200 after LPP ablation to form a blank pattern 208 in dielectric 202 at the necking region, such as necking region 102. The necking region is normally a little larger than the die shadow, containing fine lines and spaces for I/O signal routing and fan-out.

Figure 2D:

FIG. 2D depicts substrate 200 after electroless copper seed layer plating followed with electrolytic copper plating 210 to specific thickness, for example, 5-20 um. The necking area is covered with over-plated copper 212 on the dielectric top surface.

Figure 2E:

FIG. 2E depicts substrate 200 after removal of over-plated copper 212 using a selection of methods such as CMP, mechanical polishing, chemical etching or the combination of the above. After this step the necking region of the pattern is completed.

Figure 2F:

FIG. 2F depicts substrate 200 after electroless copper 214 plating and dry film resist (DFR) 216 lamination.

Figure 2G:
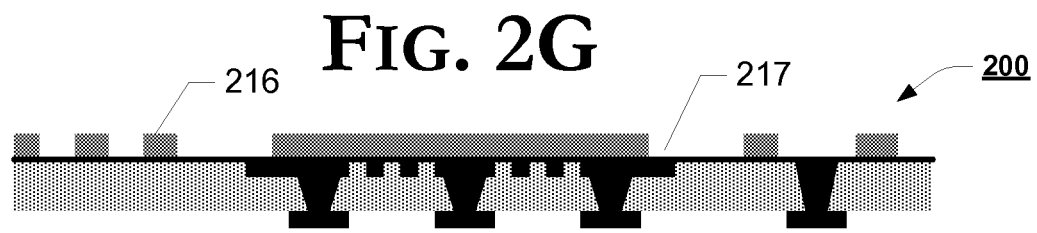

FIG. 2G depicts substrate 200 after DFR 216 is patterned with conventional litho process (exposure and development). The necking region patterned is covered with DFR 216, except for outer portions 217 of the necking region.

Figure 2H:
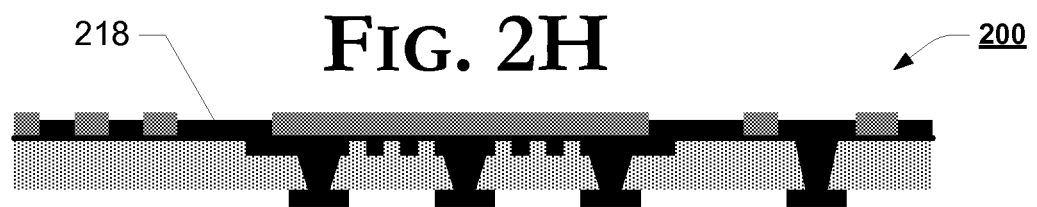

FIG. 2H depicts substrate 200 after electrolytic copper 218 plating to specific thickness, for example, 5-20 um. In this way, the main routing region is plated on top of the outer portions 217 of the necking routing region.

Figure 2I:

FIG. 2I depicts substrate 200 after DFR 216 is stripped using alkali solutions such as aqueous sodium carbonate solution. Organic type of solution can also be used.

Figure 2J:
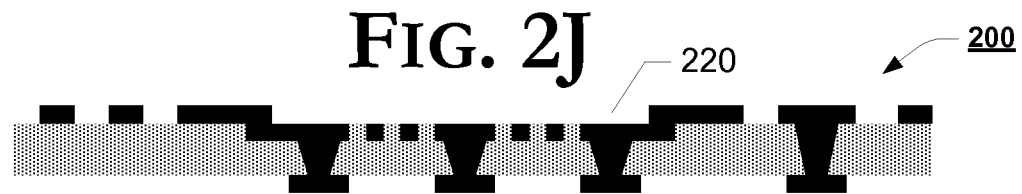

FIG. 2J depicts substrate 200 after chemical etching to remove the electroless copper seed layer 214 to form the whole pattern.

In one embodiment, package substrate 200 is coupled on surface 220 with an integrated circuit die such as a flip chip silicon die. In another embodiment, surface 220 is laminated with another dielectric layer as part of a continued build-up process.

Figure 3G:

FIGS. 3A-3K are graphical illustrations of a cross-sectional view of a partially formed IC package substrate, in accordance with one example embodiment of the invention. FIG. 3A depicts substrate 300 after build-up dielectric is laminated on core or existing layer, including pads 304, followed with pre-cure of the dielectric. The dielectric materials are generally polymer based and filled with dispersed silica fillers, such as commercially available fillers and a variety of other materials.

FIG. 3B depicts substrate 300 after a dielectric protrusion 306 is made on dielectric surface 307 at the necking region. This can be made by selectively laminating an added layer of dielectric, or by imprinting the dielectric layer laminated in step 1 with a pocket that corresponds to the protrusion to be formed.

FIG. 3C depicts substrate 300 after laser via 308 drilling over the whole pattern and desmear. The desmear process comprises of swelling the walls of via 308 using alkali solution such as sodium hydroxide, and them etching with highly reductive chemical such as permanganate based aqueous solution.

FIG. 3D depicts substrate 300 after LPP ablation to form a blank pattern 310 within protrusion 306 at the necking region. The neck region is normally a little larger than the die shadow, containing fine lines and spaces for I/O signal routing and fan-out.

FIG. 3E depicts substrate 300 after electroless copper seed layer 312 plating over the whole pattern.

FIG. 3F depicts substrate 300 after DFR 314 lamination over the whole pattern.

FIG. 3G depicts substrate 300 after DFR 314 is patterned with conventional litho process (exposure and development). The necking region pattern 310 is exposed after litho. Main region pattern 316 outside the necking region is defined.

Figure 3H:
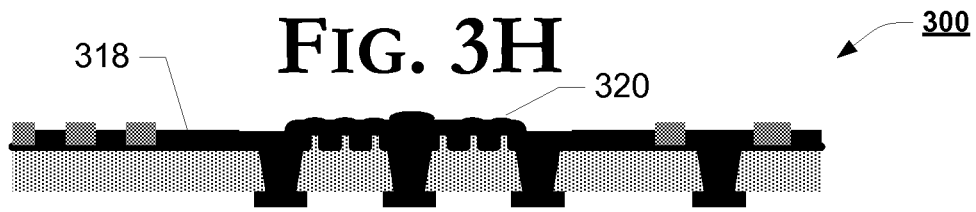

FIG. 3H depicts substrate 300 after electrolytic plating 318 of the whole pattern to specific thickness, for example, 5-20 um. The necking area is covered with over-plated copper 320 on the top surface of the dielectric layer.

Figure 3I:
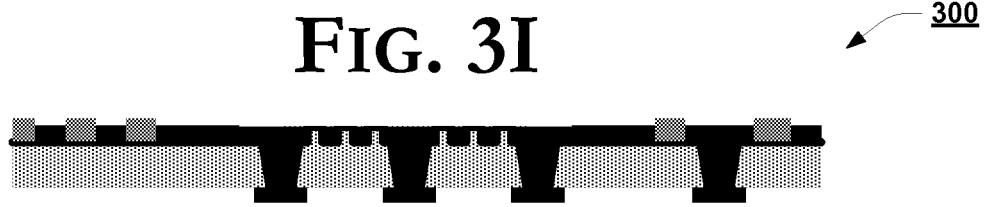

FIG. 3I depicts substrate 300 after removal of over-plated copper 320 using a selection of methods such as chemical mechanical polishing (CMP), mechanical polishing, chemical etching or the combination of the above. After this step the necking region of the pattern is completed.

Figure 3J:
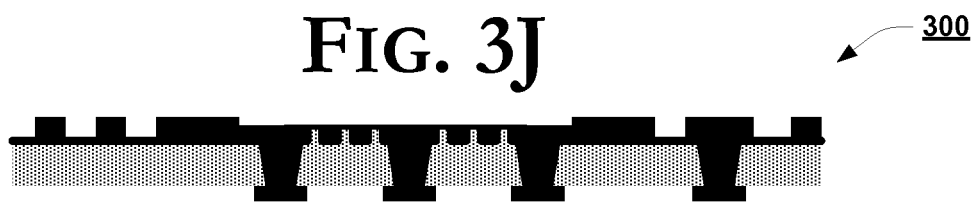

FIG. 3J depicts substrate 300 after DFR 314 is stripped using alkali solutions such as aqueous sodium carbonate solution. Organic type of solution can also be used.

Figure 3K:

FIG. 3K depicts substrate 300 after chemical etching to remove the electroless copper seed layer 312 to form the whole pattern.

In one embodiment, package substrate 300 is coupled on surface 322 with an integrated circuit die such as a flip chip silicon die. In another embodiment, surface 322 is laminated with another dielectric layer as part of a continued build-up process.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
forming a dielectric protrusion on a laminated substrate surface, the dielectric including a necking region and a main routing region, the necking region including an area within a footprint of a die to be situated on the dielectric, and the main routing region contiguous with the necking region and extending outwardly therefrom;
ablating only the dielectric in the necking region with laser projection patterning (LPP);
plating the main routing region and the necking region with copper;
removing over-plated copper from the main routing region and the necking region;
electroless copper plating over the main routing region and the necking region;
patterning the main routing region and the necking region on the dielectric with dry film resist (DFR);
plating the main routing region such that a routing density in the necking region is greater than a routing density in the main region; and
removing the DFR.

2. The method of claim 1, wherein forming a dielectric protrusion on a laminated substrate surface comprises selectively laminating an added layer of dielectric.

3. The method of claim 1, wherein forming a dielectric protrusion on a laminated substrate surface comprises imprinting the substrate surface with a pocket that corresponds to the protrusion to be formed.

4. The method of claim 1, wherein plating the main routing and necking regions comprises over-plating the necking region.

5. The method of claim 4, further comprising removing the over-plated copper on top of the necking region.

6. The method of claim 1, wherein plating the main routing and necking regions comprises electrolytic copper plating to a thickness of between about 5 and about 20 micrometers.

7. The method of claim 1, wherein plating the main routing and necking regions comprises plating features that span the main routing and necking regions in a same electrolytic plating step.

* * * * *